United States Patent
Zohar

(10) Patent No.: US 10,504,692 B2
(45) Date of Patent: Dec. 10, 2019

(54) METHOD AND SYSTEM FOR GENERATING A SYNTHETIC IMAGE OF A REGION OF AN OBJECT

(71) Applicant: Applied Materials Israel Ltd., Rehovot (IL)

(72) Inventor: Zeev Zohar, Migdal (IL)

(73) Assignee: Applied Materials Israel Ltd., Rehovot (IL)

( * ) Notice: Subject to any disclaimer, the term of this patent is extended or adjusted under 35 U.S.C. 154(b) by 0 days.

(21) Appl. No.: 16/052,094

(22) Filed: Aug. 1, 2018

(65) Prior Publication Data
US 2019/0043688 A1 Feb. 7, 2019

Related U.S. Application Data

(60) Provisional application No. 62/541,887, filed on Aug. 7, 2017.

(51) Int. Cl.
*H01J 37/22* (2006.01)
*G06K 9/62* (2006.01)
(Continued)

(52) U.S. Cl.
CPC .......... *H01J 37/222* (2013.01); *G06K 9/0014* (2013.01); *G06K 9/46* (2013.01);
(Continued)

(58) Field of Classification Search
CPC ............... H01J 37/222; H01J 2237/221; H01J 2237/226; H01J 2237/2802; G06N 20/00;
(Continued)

(56) References Cited

U.S. PATENT DOCUMENTS 9,159,119 B2 10/2015 Shechtman et al.
2009/0266985 A1* 10/2009 Nakahira ................ G06T 5/002
250/307

(Continued)

OTHER PUBLICATIONS

Tsiper, S., et al. "Sparsity-Based Super Resolution for SEM Images," Electrical Engineering Department, Physics Department and Solid-State Institute, Technion, Haifa 32000, Israel, Applied Materials, 9 Oppenheimer St., Rehovot 76705, Israel, Aug. 29, 2017, 10 pages.

*Primary Examiner* — David E Smith
(74) *Attorney, Agent, or Firm* — Kilpatrick Townsend & Stockton LLP

(57) ABSTRACT

A method for generating a synthetic image of a region of an object, includes: generating, by a charged particle microscope, a charged particle microscope image of the region of the object; calculating a sparse representation of the charged particle microscope image; wherein the sparse representation of the charged particle microscope image comprises multiple first atoms; generating the synthetic image of the region, wherein the synthetic image of the region is formed from multiple second atoms; wherein the generating of the synthetic image of the region is based on a mapping between the multiple first atoms and the multiple second atoms; wherein the charged particle microscope image and the multiple first atoms are of a first resolution; and wherein the synthetic image of the region and the multiple second atoms are of a second resolution that is finer than the first resolution.

18 Claims, 11 Drawing Sheets

(51) Int. Cl.
*G06K 9/46* (2006.01)
*G06K 9/00* (2006.01)
*G06N 20/00* (2019.01)

(52) U.S. Cl.
CPC ........... *G06K 9/6255* (2013.01); *G06N 20/00* (2019.01); *G06K 2009/4695* (2013.01); *H01J 2237/221* (2013.01); *H01J 2237/226* (2013.01); *H01J 2237/24495* (2013.01); *H01J 2237/28* (2013.01); *H01J 2237/2802* (2013.01)

(58) Field of Classification Search
CPC ...... G06K 9/0014; G06K 9/46; G06K 9/6255; G06K 2009/4695
See application file for complete search history.

(56) References Cited

U.S. PATENT DOCUMENTS

| | | | |
|---|---|---|---|
| 2011/0187847 A1* | 8/2011 | Bai | H01J 37/222 348/80 |
| 2013/0010100 A1* | 1/2013 | Kotaki | G01B 15/04 348/80 |
| 2018/0182067 A1* | 6/2018 | Liu | G06T 3/4053 |

* cited by examiner

METHOD AND SYSTEM FOR GENERATING A SYNTHETIC IMAGE OF A REGION OF AN OBJECT

CROSS-REFERENCES TO RELATED APPLICATIONS

This application claims the benefit of U.S. Provisional Application No. 62/541,887, filed Aug. 7, 2017, the contents of which are hereby incorporated herein by reference in their entirety.

BACKGROUND

Unless otherwise indicated herein, the materials described in this section are not prior art to the claims in this application and are not admitted to be prior art by inclusion in this section.

The scanning electron microscope (SEM) is a versatile examination and analysis tools for objects at high resolutions. High resolutions include sub-nanometer resolution. A SEM can operate in two basic modes: a low resolution (LR) mode and a high resolution (HR) mode. The HR mode is considered costly since HR mode exhibits a lengthy acquisition time and provides a smaller field of view in relation to the LR mode. On the other hand, the HR mode is advantageous in the chip inspection industry, as the ever-increasing demand for faster and more energy efficient microchips is shifting the industry towards smaller structures. This shift also pushes current SEM technology to its limit.

The SEM resolution and acquisition time have become dominant factors that constantly require improvement. Consequently, there is great interest in scanning large areas quickly, while achieving high resolution. Accordingly, there is a need to provide a method that breaks the immediate link between the inherent physical scanning resolution of the SEM and the resolution of the output image.

SUMMARY

Apparatuses and methods for generating a synthetic image of a region of an object are provided.

According to various aspects there is provided a method for generating a synthetic image of a region of an object. In some aspects, the method may include: generating, by a charged particle microscope, a charged particle microscope image of the region of the object; calculating a sparse representation of the charged particle microscope image, the sparse representation of the charged particle microscope image may include multiple first atoms; and generating the synthetic image of the region. The synthetic image of the region may be formed from multiple second atoms. The generating of the synthetic image of the region may be based on a mapping between the multiple first atoms and the multiple second atoms. The charged particle microscope image and the multiple first atoms may be of a first resolution. The synthetic image of the region and the multiple second atoms may be of a second resolution. The second resolution may be finer than the first resolution.

The generating of the charged particle microscope image may be preceded by performing a dictionary learning process for generating at least one dictionary that may include the multiple first atoms and the multiple second atoms. The performing of the dictionary learning process may include acquiring first resolution charged particle microscope images of a reference object and acquiring a second resolution charged particle microscope images of the reference object.

The generating of the charged particle microscope image may be preceded by receiving at least one dictionary that may include the multiple first atoms and the multiple second atoms. The generating of the charged particle microscope image may be preceded by performing a dictionary learning process for generating at least one dictionary that may include multiple first atoms and multiple second atoms. The multiple first atoms and the multiple second atoms may be related to multiple perspectives of the charged particle microscope.

The performing of the dictionary learning process may include calculating a mapping between first atoms and second atoms that may be related to different perspectives. The charged particle microscope image may be related to a certain perspective of the charged particle microscope. The calculating of the sparse representation of the charged particle microscope image may be based on at least one first atom that may be related to another perspective of the charged particle microscope. The charged particle microscope image may be related to a certain perspective of the charged particle microscope. The calculating of the sparse representation of the charged particle microscope image may be based on first atoms that may be related to at least two perspectives out of the multiple perspectives. The charged particle microscope image may be related to a certain perspective of the charged particle microscope. The synthetic image may be related to another perspective.

The generating of the charged particle microscope image may be preceded by receiving one or more dictionaries that may be related to multiple perspectives of the charged particle microscope. The charged particle microscope image may include multiple charged particle microscope patches. The calculating of the sparse representation of the charged particle microscope image may include calculating sparse representations of the multiple charged particle microscope patches. The generating of the synthetic image may include generating multiple synthetic image patches.

The method may include calculating a confidence attribute for each synthetic image patch of the multiple synthetic image patches. A confidence attribute of a given synthetic image patch of the multiple synthetic image patches may be associated with a number different second atoms that may be included in the given synthetic image patch.

The method may include detecting a suspected defect in the region based on a number of different second atoms that form an element of the synthetic image. The region of the object may be an edge region of the object.

According to various aspects there is provided a method for defect detection. In some aspects, the method may include: generating, by a charged particle microscope, a charged particle microscope image of a region of an object; calculating a sparse representation of the charged particle microscope image, the sparse representation of the charged particle microscope image may include multiple first atoms; and evaluating an existence of a suspected defect in the region based on a number of different first atoms that form an element of the sparse representation of the charged particle microscope image.

According to various aspects there is provided a computer program product that stores instructions. In some aspects, the computer program may include instructions that once executed by a charged particle microscope causes the charged particle microscope to: generate a charged particle microscope image of the region of the object; calculate a sparse representation of the charged particle microscope image, the sparse representation of the charged particle microscope image may include multiple first atoms; and generate the synthetic image of the region, the synthetic image of the region may be formed from multiple second atoms. A generating of the synthetic image of the region may be based on a mapping between the multiple first atoms and the multiple second atoms. The charged particle microscope image and the multiple first atoms may be of a first resolution. The synthetic image of the region and the multiple second atoms may be of a second resolution that may be finer than the first resolution.

According to various aspects there is provided a charged particle microscope. In some aspects, the charged particle microscope may include: charged particle optics; at least one charged particle detector; and a processor. The charged particle optics and the at least one charged particle detector may be configured to generate a charged particle microscope image of the region of the object. The processor may be configured to: calculate a sparse representation of the charged particle microscope image, the sparse representation of the charged particle microscope image may include multiple first atoms; and generate the synthetic image of the region, the synthetic image of the region may be formed from multiple second atoms. A generating of the synthetic image of the region may be based on a mapping between the multiple first atoms and the multiple second atoms. The charged particle microscope image and the multiple first atoms may be of a first resolution. The synthetic image of the region and the multiple second atoms may be of a second resolution that may be finer than the first resolution.

Numerous benefits are achieved by way of the various embodiments over conventional techniques. For example, the various embodiments provide methods and system that can be used to circumvent basic limits of conventional SEM techniques. In some embodiments, high quality synthetic HR images may be generated while operating a SEM in a LR mode. Sparse coding and dictionary learning may be used to enhance LR images while reducing noise. Resolution of a LR image obtained using a fast scan may be enhanced up to a level of a HR image obtained using a slow scan. In some embodiments, a system, a method, and a computer program product for detecting defects in a region of an object based on a sparse representation of a SEM image the object. These and other embodiments along with many of its advantages and features are described in more detail in conjunction with the text below and attached figures.

BRIEF DESCRIPTION OF THE DRAWINGS

Aspects and features of the various embodiments will be more apparent by describing examples with reference to the accompanying drawings, in which.

DETAILED DESCRIPTION

While certain embodiments are described, these embodiments are presented by way of example only, and are not intended to limit the scope of protection. The apparatuses, methods, and systems described herein may be embodied in a variety of other forms. Furthermore, various omissions, substitutions, and changes in the form of the example methods and systems described herein may be made without departing from the scope of protection.

The following text includes various examples that refer to a SEM. One of ordinary skill in the art will appreciate that SEM is a non-limiting example of a charged particle microscope. A charged particle may be an electron or an ion. Other non-limiting examples of a charge particle microscope include a transmission electron microscope (TEM), an ion microscope, and a scanning transmission electron microscope (STEM).

Further, the following text includes various examples that refer to a high resolution and low resolution. One of ordinary skill in the art will appreciate that high resolution and low resolution are a non-limiting example of resolutions that differ from each other.

In accordance with various aspects of the present disclosure, there is provided a system, a method, and a computer program product for generating a synthetic HR image while operating a SEM in a LR mode, providing the benefits of high quality of the HR mode and the speed of the LR mode. Further, in accordance with various aspects of the present disclosure, there is provided a system, a method, and a computer program product for detecting defects in a region based on a sparse representation of a SEM image.

Figure 1:
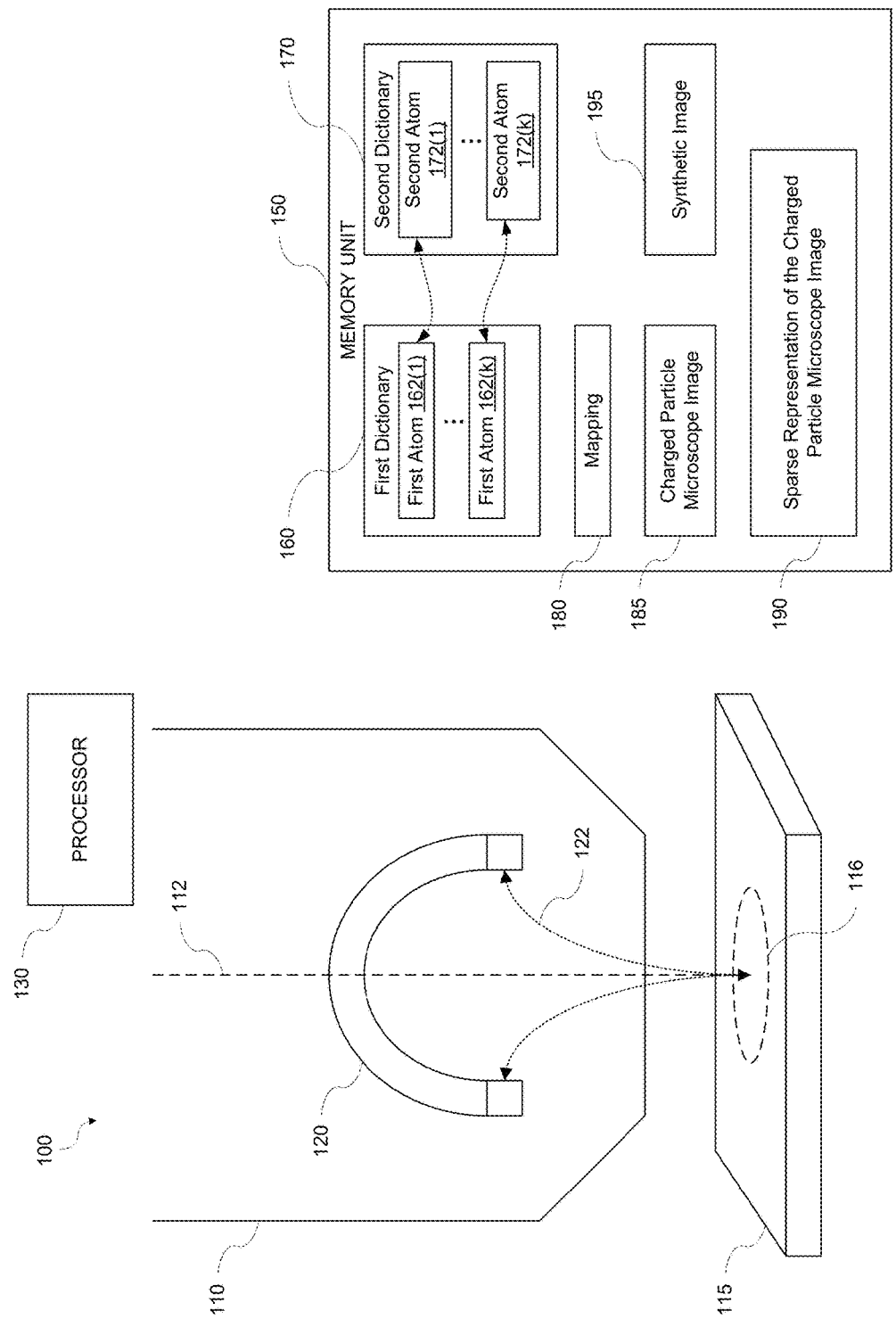
FIG. 1 is a block diagram illustrating a first embodiment of a charged particle microscope and associated images and dictionaries according to various aspects of the present disclosure.

FIG. 1 is a block diagram illustrating a first embodiment of a charged particle microscope 100 and associated images and dictionaries according to various aspects of the present disclosure. As illustrated in FIG. 1, the charged particle microscope 100 may include a charged particle optics unit 110. The charged particle optics unit 110 may include an in-lens detector 120. The in-lens detector 120 may be located within charged particle optics unit 110. The in-lens detector 120 is an example of a detector of the charged particle microscope 100. The charged particle microscope 100 may include other detectors, for example, but not limited to, out-of-lens detectors, that may be located outside the charge particle optics unit 110. One of ordinary skill in the art will appreciate that other in-lens and out-of-lens detectors may be used without departing from the scope of the present disclosure.

The charged particle microscope 100 may scan a region 116 of an object 115 with a charged particle beam 112 that is generated by the charged particle optics unit 110. The region 116 of the object 115 may have any shape and/or size and may include any part of the object 115. The object 115 may be, for example, but not limited to, a semiconductor wafer, semiconductor device die, photolithography mask, etc. The in-lens detector 120 may detect charged particles 122 that are emitted from the region 116 of the object 115.

When the charged particle microscope 100 operates in a HR mode, the field of view may be, for example, 3 micron by 3 micron or another size, and each field of view may include 480 pixels by 480 pixels or another number of pixels. The size of each pixel in the HR mode may be, for example, about 6.25 nanometer by 6.25 nanometer or another size. One of ordinary skill in the art will appreciate that fields of view of other sizes may be used, fields of view of non-rectangular shape may be used, pixels of other sizes may be used, and the pixels of non-rectangular shape may be used without departing from the scope of the present disclosure.

When the charged particle microscope 100 operates in a LR mode, the field of view may be, for example, 10 micron by 10 micron or another size, and each field of view may include, for example, 480 pixels by 480 pixels or another number of pixels. The size of each pixel in the LR mode may be, for example, about 20.833 nanometer by 20.833 nanometer or another size. One of ordinary skill in the art will appreciate that fields of view of other sizes may be used, fields of view of non-rectangular shape may be used, pixels of other sizes may be used and the pixels of non-rectangular shape may be used without departing from the scope of the present disclosure.

The charged particle microscope 100 may include a processor 130. Alternatively, the processor 130 may not be part of the charged particle microscope 100. For example, the processor 130 may be part of a computerized system that controls the charged particle microscope 100 and/or performs analysis of information outputted from the charged particle microscope 100. The outputted information may include images produced by the charged particle microscope 100.

The processor 130 may be a hardware processor and may include, for example, but not limited to, one or more processing chips, one or more systems on chips, one or more hardware accelerators, one or more processing cards, etc.

The charged particle microscope 100 may include one or more memory units 150. Alternatively, the one or more memory units 150 may not be a part of the charged particle microscope 100. For example, the one or more memory units 150 may be part of a computerized system that controls the charged particle microscope 100 and/or performs analysis of information outputted from the charged particle microscope 100. The outputted information may include images produced by the charged particle microscope 100.

The generation of synthetic images may involve using one or more dictionaries generated using a dictionary learning process. A dictionary learning process may involve building a dictionary over which a family of signals sharing the same or similar structural features is sparsely represented. A training set of measurements may be obtained comprising LR and HR patches of SEM images. The training set of measurements may be obtained from previously measured images of an object. In some embodiments, the previously measured images may be processed images, enhanced images, combined images, simulated images, and/or the like. The training set allows known dictionary learning algorithms to construct a dictionary that contains basic building blocks that compose the signal family.

The SEM sparse representation of the SEM image may be formed of atoms. Atoms may be the building blocks of the one or more dictionaries. An atom may comprise a patch of a SEM image. The number of different atoms that reconstruct an element of the sparse representation may be indicative of a suspected defect. Referring again to FIG. 1, the one or more memory units 150 may store the following dictionaries and images:

A first dictionary 160. The first dictionary 160 may include multiple first atoms 162(1)-162(k), where k is a positive integer that exceeds two. The multiple first atoms 162(1)-162(k) may be of first resolution. The first resolution may be LR so that each first atom may be a LR patch of a SEM image.

A second dictionary 170. The second dictionary 170 may include multiple second atoms 172(1)-172(k). The multiple second atoms 172(1)-172(k) may be of second resolution. The second resolution may be HR so that each second atom may be a HR patch of a SEM image. Thus, the second resolution may be finer than the first resolution.

A mapping 180. The mapping 180 may map each first atom 162(1)-162(k) to a corresponding second atom 172(1)-172(k). The corresponding atoms may be obtained from the same region 116 of the object 115. One of ordinary skill in the art will appreciate that the mapping may be explicit or implicit. An implicit mapping may be represented by the arrangement of the first and second atoms within the dictionaries.

A charged particle microscope image 185. The charged particle microscope image 185 may be an image of the region 116 of the object 115 that is acquired by illuminating the region 116 by the charged particle microscope 100.

A sparse representation 190 of the charged particle microscope image 185. The sparse representation 190 may be formed of first atoms 162(1)-162(k) that represent charged particle microscope image 185.

A synthetic image 195. The synthetic image 195 may be a second resolution representation of the sparse representation 190. The second resolution may be higher than the first resolution and may be a same resolution as the HR patch. The synthetic image 195 may be computed by mapping the first atoms 162(1)-162(k) of the sparse representation 190 to corresponding second atoms 172(1)-172(k). The corresponding second atoms may be second atoms 172(1)-172(k) that may be mapped by the mapping 180 to the first atoms 162(1)-162(k) that form sparse representation 190.

Referring to FIG. 1, the one or more memory units 150 may store a first dictionary 160, a second dictionary 170, and a mapping 180 between atoms. One of ordinary skill award will appreciate that the first dictionary, the second dictionary and the mapping between the atoms may be merged to a single dictionary without departing from the scope of the present disclosure. The mapping 180 may be represented by the location of the atoms within the dictionary. For example, storing a first atom and a second atom in a concatenated manner may indicate that the first atom and the second atom are mapped to each other.

Figure 2:
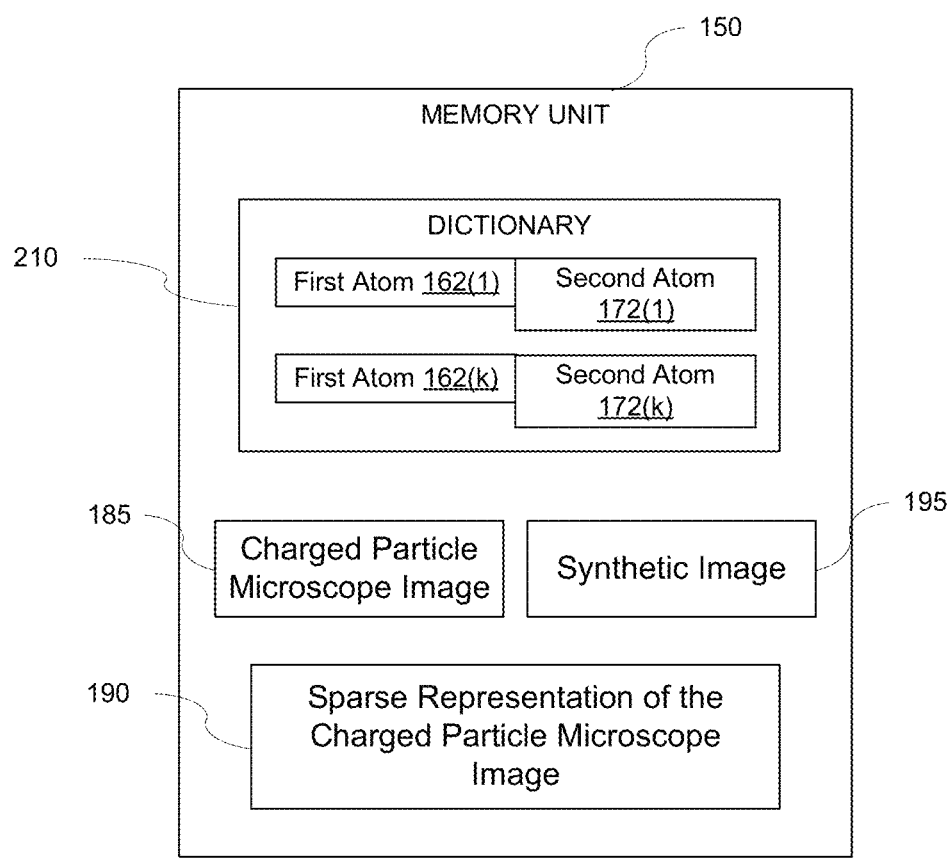
FIG. 2 is a block diagram illustrating a dictionary in which each first atom and second atom that are mapped to each other are concatenated according to various aspects of the present disclosure.

FIG. 2 is a block diagram illustrating a dictionary 210 in which each first atom 162(1)-162(k) and each corresponding second atom 172(1)-172(k) that are mapped to each other are concatenated according to various aspects of the present disclosure. For example, the first atom 162(1) and the second atom 172(1) may be mapped to each other and may be concatenated. As another example, the first atom 162(k) and the second atom 172(k) may be mapped to each other and may be concatenated. The first and second atoms that are mapped to each other may be arranged in any predefined manner that reflects the mapping between the first and second atoms.

Figure 3:
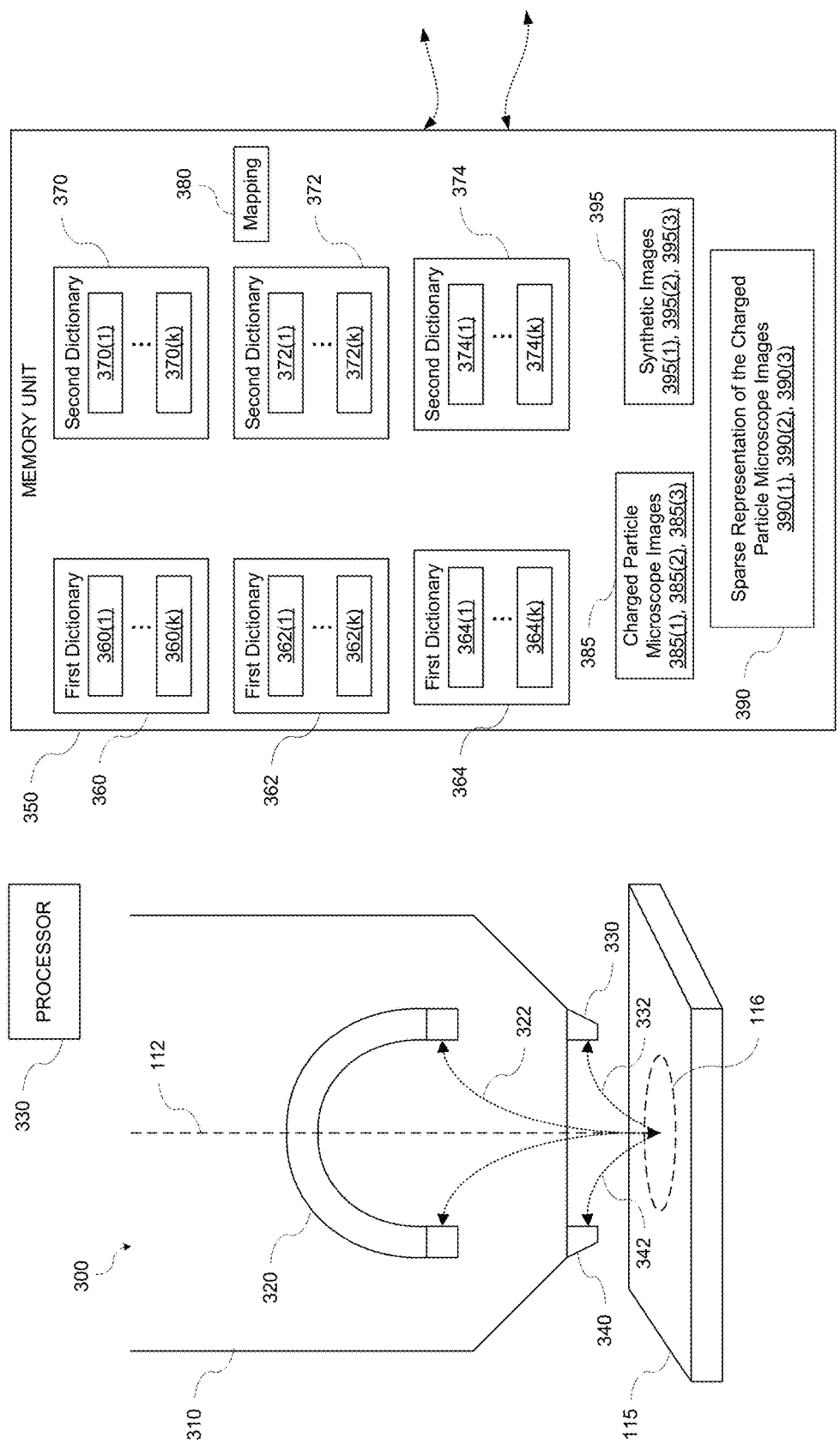
FIG. 3 is a block diagram illustrating a second embodiment of a charged particle microscope and associated images and dictionaries according to various aspects of the present disclosure.

FIG. 3 is a block diagram illustrating a second embodiment of a charged particle microscope 300 and associated images and dictionaries according to various aspects of the present disclosure. As illustrated in FIG. 3, the charged particle microscope 300 may include a charged particle optics unit 310, a first perspective detector 320, a second perspective detector 330, and a third perspective detector 340. The first perspective detector 320 may be an in-lens detector that may detect first perspective charged particles (CPs) 322. The second perspective detector 330 may be an out-of-lens detector that may detect second perspective CPs 332. The third perspective detector 340 may be an out-of-lens detector that may detect third perspective CPs 342. Each perspective may correspond, for example, to a different viewing angle of a sample, to a different detector of the charged particle microscope 300, and the like.

One of ordinary skill in the art will appreciate that the number of different perspectives detectors may be two or may exceed three without departing from the scope of the present disclosure. Further, different perspective detectors may be any combination of detectors, for example, in-lens detectors, out-of-lens detectors, etc.

The charged particle microscope 300 may scan a region 116 of an object 115 with a charged particle beam 112 that may be generated by charged particle optics unit 310. The region 116 may have any shape and/or size and may include any part of the object 115. The object 115 may be, for example, but not limited to, a semiconductor wafer, a semiconductor device die, etc. The three different detectors may collect charged particles 322, 332, 342 that may be emitted from the region 116 of the object 115 from different perspectives.

The charged particle microscope 300 may include a processor 330. Alternatively, the processor 330 may not be part of the charged particle microscope 300. For example, the processor 330 may be part of to a computerized system that controls the charged particle microscope 300 and/or performs analysis of information outputted from the charged particle microscope 300. The outputted information may include images produced by the charged particle microscope 300.

The processor 330 may be a hardware processor and may include, for example, but not limited to, one or more processing chips, one or more systems on chips, one or more hardware accelerators, one or more processing cards, etc.

The charged particle microscope 300 may include one or more memory units 350. Alternatively, the one or more memory units 350 may not be a part of the charged particle microscope 300. For example, the one or more memory units 350 may be part of a computerized system that controls the charged particle microscope 300 and/or performs analysis of information outputted from the charged particle microscope 300. The outputted information may include images produced by the charged particle microscope 300.

Referring again to FIG. 3, the one or more memory units 350 may store the following dictionaries and images:

A first dictionary related to a first perspective 360. The first dictionary related to the first perspective 360 may include multiple (k) atoms 360(1)-360(k). The multiple atoms 360(1)-360(k) may be of a first resolution.

A first dictionary related to a second perspective 362. The first dictionary related to the second perspective 362 may include multiple (k) atoms 362(1)-362(k). The multiple atoms 362(1)-362(k) may be of the first resolution.

A first dictionary related to a third perspective 364. The first dictionary related to the third perspective 364 may include multiple (k) atoms 364(1)-364(k). The multiple atoms 364(1)-364(k) may be of the first resolution.

A second dictionary related to the first perspective 370. The second dictionary related to the first perspective 370 may include multiple (k) atoms 370(1)-370(k). The multiple atoms 370(1)-370(k) may be of the first resolution.

A second dictionary related to the second perspective 372. The second dictionary related to the second perspective 372 may include multiple (k) atoms 372(1)-372(k). The multiple atoms 372(1)-372(k) may be of the first resolution.

A second dictionary related to the third perspective 374. The second dictionary related to the third perspective 374 may include multiple (k) atoms 374(1)-374(k). The multiple atoms 374(1)-374(k) may be of the first resolution.

A mapping 380. The mapping 380 may map an atom to other corresponding atoms. For example, for each value of k ranging between 1 and k, atom 360(k) may be mapped to at least some of atoms 362(k), 364(k), 370(k), 372(k), and 374(k).

A first charged particle microscope image 385(1). The first charged particle microscope image 385(1) may be an image (e.g., from a first perspective) of the region 116 that may be acquired by scanning the region 116 of the object 115 by the charged particle microscope 300.

A second charged particle microscope image 385(2). The second charged particle microscope image 385(2) may be an image (e.g., from a second perspective) of the region 116 of the object 115 that may be acquired by scanning the region 116 by the charged particle microscope 300.

A third charged particle microscope image 385(3). The third charged particle microscope image 385(3) may be an image (e.g., from a third perspective) of the region 116 of the object 115 that is acquired by scanning the region 116 by the charged particle microscope 300.

A first sparse representation 390(1) of the charged particle microscope image 385(1). The first sparse representation 390(1) may be formed from one or more atoms of first dictionary related to the first perspective 360.

A second sparse representation 390(2) of the charged particle microscope image 385(2). The second sparse representation 390(2) may be formed from one or more atoms of first dictionary related to the second perspective 362.

A third sparse representation 390(3) of the charged particle microscope image 385(3). The third sparse representation 390(3) may be formed from one or more atoms of first dictionary related to the third perspective 364.

A first synthetic image 395(1). The first synthetic image 395(1) may be a second resolution representation of the sparse representation 390(1). The first synthetic image 395(1) may be executed by mapping the atoms of the first sparse representation 390(1) to corresponding atoms out of the multiple (k) atoms 370(1)-370(k).

A second synthetic image 395(2). The second synthetic image 395(2) may be a second resolution representation of the second sparse representation 390(2). The second synthetic image 73(2) may be executed by mapping the atoms of the sparse representation 390(2) to corresponding atoms out of the multiple (k) atoms 372(1)-372(k).

A third synthetic image 395(3). The third synthetic image 395(3) may be a second resolution representation of the third sparse representation 390(3). The third synthetic image 73(3) may be executed by mapping the atoms of the sparse representation 390(3) to corresponding atoms out of the multiple (k) atoms 374(1)-374(k).

One of ordinary skill in the art will appreciate that the mapping 380 and the various dictionaries of FIG. 3 may merged to a single dictionary. The mapping 380 may be represented by the location of the atoms within the dictionaries.

Figure 4:
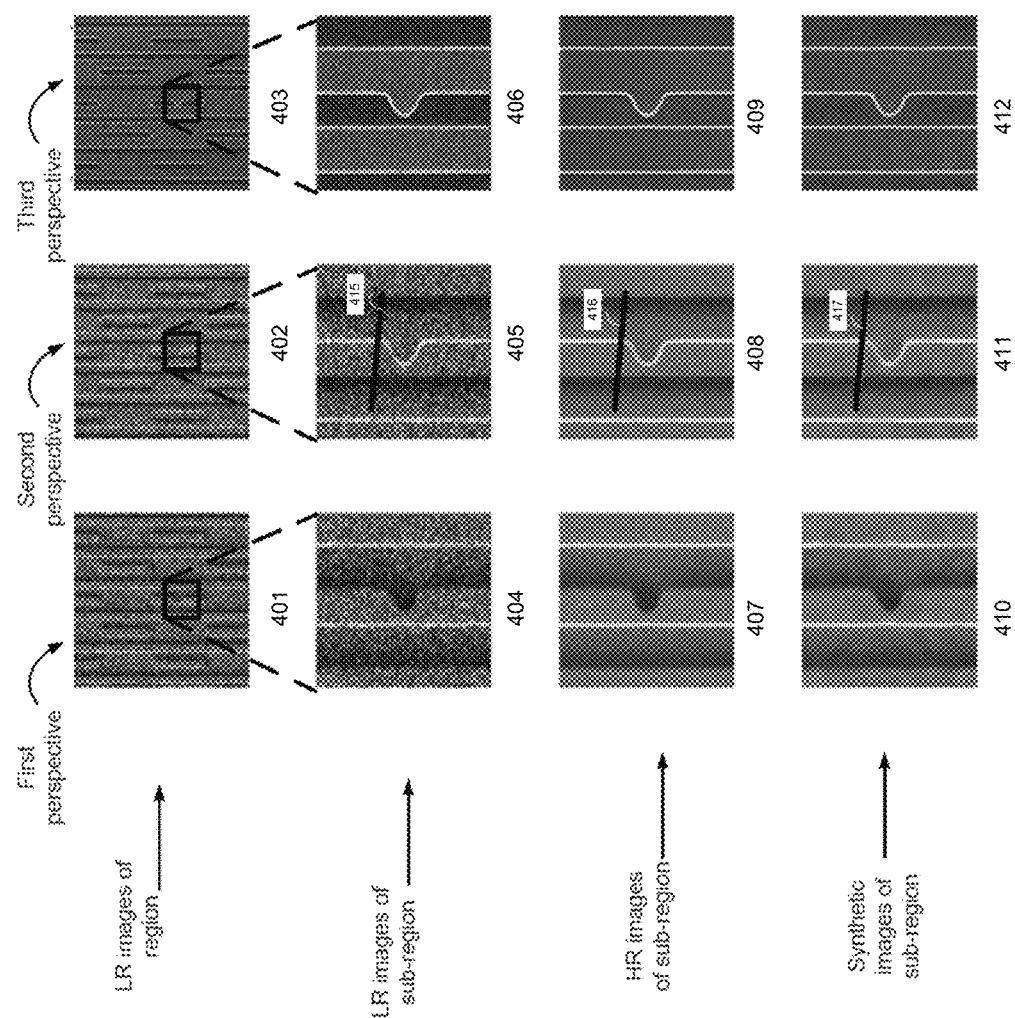
FIG. 4 is an illustration of various LR, HR, and synthetic images according to various aspects of the present disclosure.

FIG. 4 is an illustration of various LR, HR, and synthetic images according to various aspects of the present disclosure. Referring to FIG. 4:

Image 401 is a LR image related to a first perspective of a region of a chip. The region may be a rectangle having a width and length of twenty nanometers.

Image 402 is a LR image related to a second perspective of the region of the chip.

Image 403 is a LR image related to a third perspective of the region of the chip.

Image 404 is a LR image related to a first perspective of a sub-region of the chip. The sub-region is a rectangle having a width and length of five nanometers.

Image 405 is a LR image related to a second perspective of the sub-region of the chip. The line 415 in the LR image 405 illustrates an imaginary cross section.

Image 406 is a LR image related to a third perspective of the sub-region of the chip.

Image 407 is a HR image related to a first perspective of the sub-region of the chip.

Image 408 is a HR image related to a second perspective of the sub-region of the chip. The line 416 in the HR image 408 illustrates an imaginary cross section.

Image 409 is a HR image related to a third perspective of the sub-region of the chip.

Image 410 is a synthetic image related to a first perspective of the sub-region of the chip.

Image 411 is a synthetic image related to a second perspective of the sub-region of the chip. The line 417 in the synthetic image 411 illustrates an imaginary cross section.

Image 412 is a synthetic image related to a third perspective of the sub-region of the chip.

The sub-region of the chip is illustrated for brevity of explanation.

Figure 5:
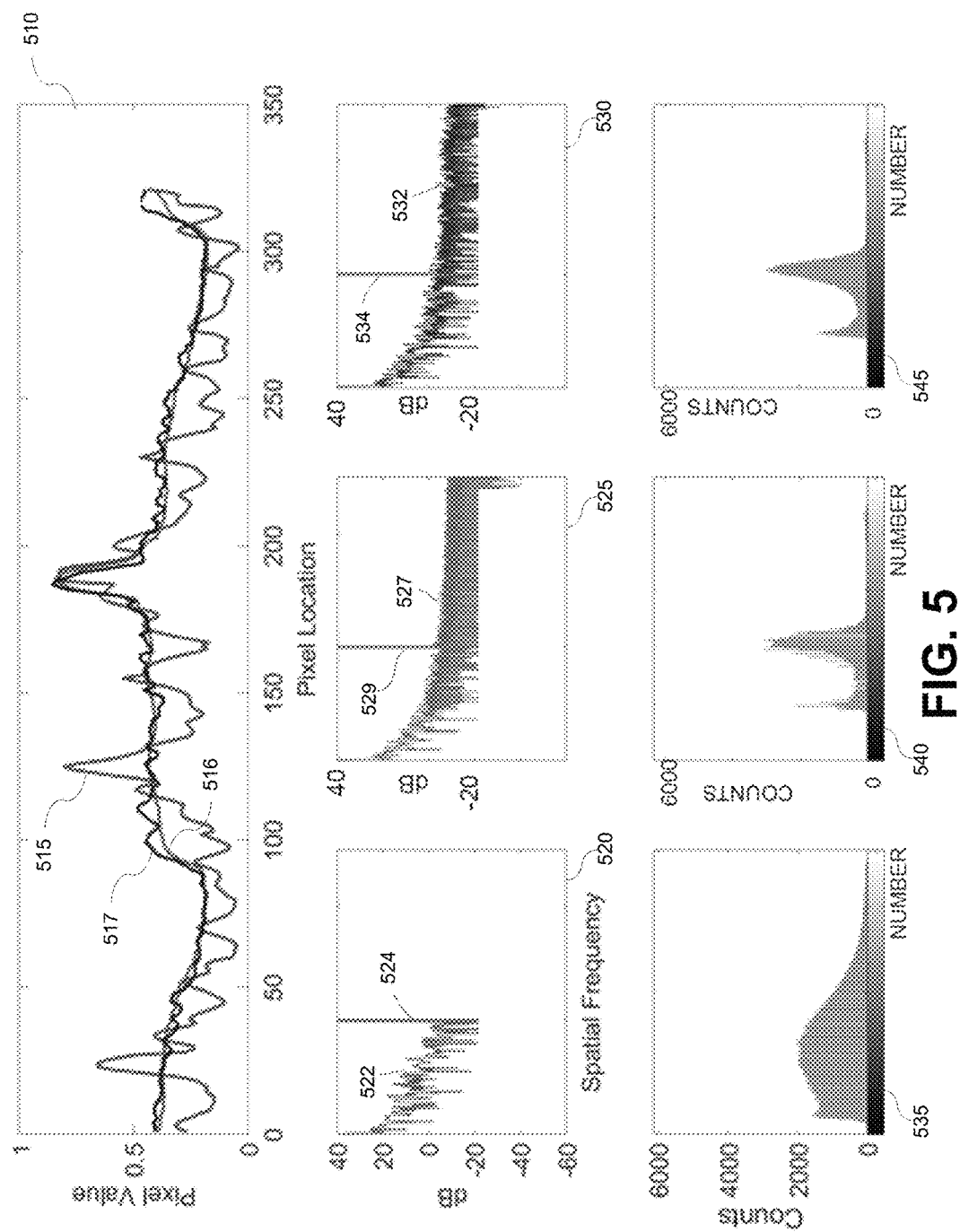
FIG. 5 is a graph and various plots related to the distribution of gray levels of the imaginary cross sections of FIG. 4 according to various aspects of the present disclosure.

FIG. 5 is a graph 510 and various plots related to the distribution of gray levels of the imaginary cross sections of FIG. 4 according to various aspects of the present disclosure. Referring to FIG. 5, the graph 510 illustrates a curve 515 that shows the distribution of gray levels along the imaginary cross section line 415 in the LR image 405 in FIG. 4, a curve 516 that shows the distribution of gray levels along the imaginary cross section line 416 in the HR image 408 in FIG. 4, and a curve 517 that shows the distribution of gray levels along the imaginary cross section line 417 in the synthetic image 411 in FIG. 4. As illustrated in the graph 510, the curves 516 and 517 substantially match each other. The curve 515 may be further processed by using a mapping between atoms related to different perspectives to better match the curves 516 and 517.

Mapping between dictionary maps of the same resolution but from different perspectives may mitigate gross errors caused by high noise. As can be seen in the graph 510, the curve 517 is very similar the curve 516, preserving all features while removing small variances that occur due to noise in the HR images.

Apart from accurately reconstructing the HR images, the curve 517 demonstrate lower noise variance even when compared to the HR images. The lower noise variance may be attributed to the sparse structure that fundamentally removes noise in an efficient manner; hence the synthetic image may to contain less noise than the HR scan. Even large differences between the imaginary cross section line 415 and the imaginary cross section line 416 may be mitigated from the imaginary cross section line 417. For example, the large peak near a pixel that is numbered one hundred twenty-five in the curve 515 is absent in the curve 517 and is absent from the curve 516, thereby exemplifying the effectiveness of the method. Thus, at least one method according to the present disclosure may remove false information that appears in the LR images, even when this information contains peaks of values twice as large as the true values that appear in the HR image.

The noise removal may be attributed to the utilization of information from the different perspectives. A systematic error present in a single perspective of the LR image may be removed by taking into account valid information from the other perspectives. Referring again to FIG. 5, plot 520 displays a one-dimensional discrete Fourier transform 522 of the gray level of pixels of the imaginary cross section line 415 and also displays cutoff frequency (i.e., maximal spatial frequency) 524 of the LR image of pixels along the imaginary cross section line 415.

Plot 525 displays a one-dimensional discrete Fourier transform 527 of the gray level of pixels of the imaginary cross section line 416 and also displays cutoff frequency 529 of the LR image of pixels along the imaginary cross section line 416. Plot 530 displays a one-dimensional discrete Fourier transform 532 of the gray level of pixels of the imaginary cross section line 417 and also displays cutoff frequency 534 of the LR image of pixels along the imaginary cross section line 417. Plot 525 and plot 530 illustrate that approximately sixty percent of a spectral content of the HR image may be correctly extrapolated.

Plot 520, plot 525, and plot 530 show that the high frequencies present in the HR image may be faithfully extrapolated in the synthetic image, well beyond the cutoff frequency present in the LR spectrum. This shows that at least one method according to the present disclosure may extrapolate approximately sixty percent of the spectral content of the HR image, effectively expanding the spatial spectrum of the LR image by a factor of about two and a half.

FIG. 5 further illustrates a histogram 535 of image 405, a histogram 540 of image 408 and a histogram 545 of image 411. Histogram 535, histogram 540 and histogram 545 illustrate that the statistical nature of the SR image may be correctly reconstructed. The horizontal axis of each histogram depicts the gray intensity values, from black to white, of the pixels in the image, while the vertical axis displays the number of pixels in each intensity bin (divided into 512 gray level bins).

The histogram 535 of the LR image 405 and the histogram 540 of the HR image 408 have a different statistical nature; nonetheless, the histogram 545 of the synthetic image 411 recovered from the LR data is almost identical to the histogram 540 of the HR image. The statistical nature of the enhanced images practically coincides with that of the HR reference, showing that the connection established between the LR dictionary and the HR dictionary may be strong enough to additionally recover the underlying statistics of the HR images using their LR counterparts.

Figure 6:
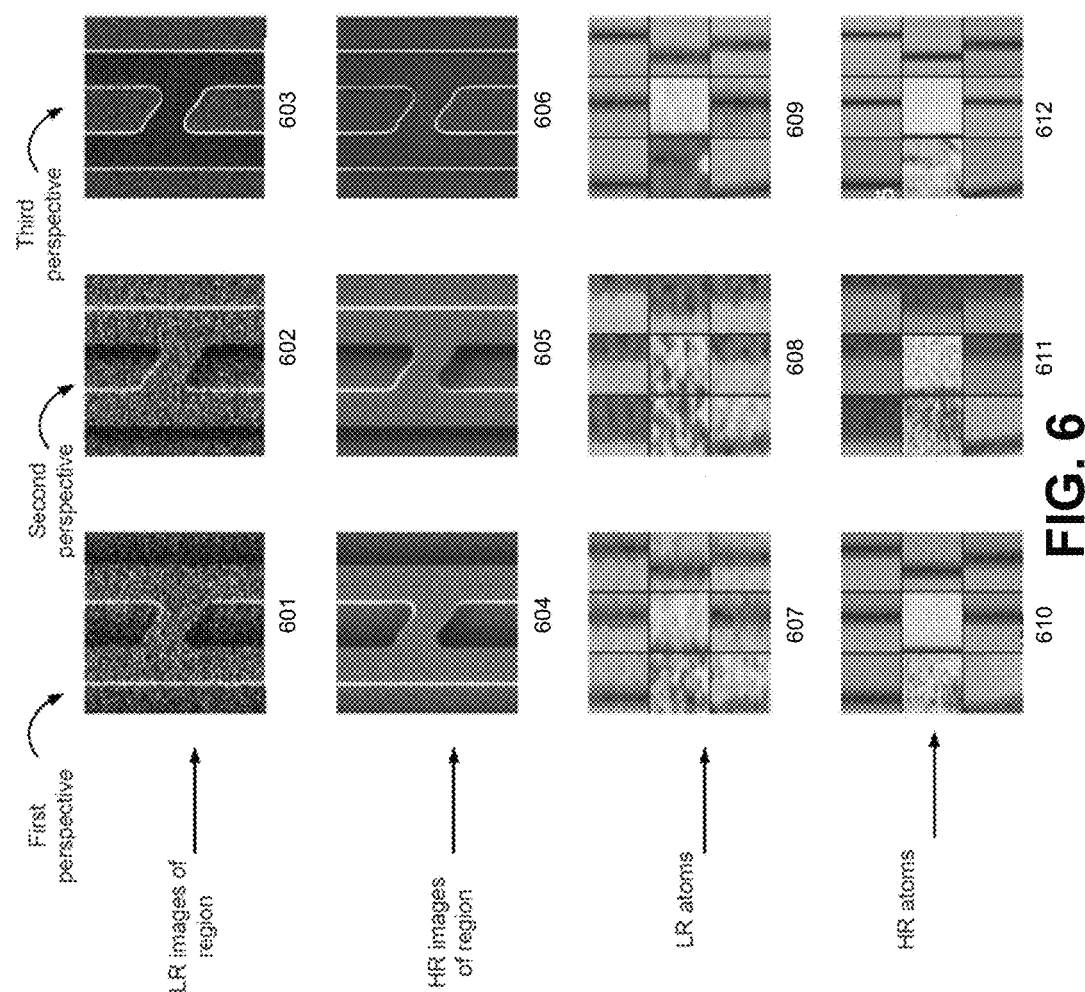
FIG. 6 is an illustration of various SEM images taken from various perspectives according to various aspects of the present disclosure.

FIG. 6 is an illustration of various SEM images taken from various perspectives according to various aspects of the present disclosure. Referring to FIG. 6:

Image 601 is a LR SEM image taken from a first perspective.
Image 602 is a LR SEM image taken from a second perspective.
Image 603 is a LR SEM image taken from a third perspective.
Image 604 is a HR SEM image taken from the first perspective.
Image 605 is a HR SEM image taken from the second perspective.
Image 606 is a HR SEM image taken from the third perspective.
Image 607 is a LR atom related to the first perspective.
Image 608 is a LR atom related to the second perspective.
Image 609 is a LR atom related to the third perspective.
Image 610 is a HR atom related to the first perspective.
Image 611 is a HR atom related to the second perspective.
Image 612 is a HR atom related to the third perspective.

LR SEM image 601, LR SEM image 602, LR SEM image 603, HR SEM image 604, HR SEM image 605, and HR SEM image 606 may be used during a dictionary learning process to assemble the dictionary. LR atom 607, LR atom 608, LR atom 609, HR atom 610, HR atom 611, and HR atom 612 may be mapped to each other.

Figure 7:
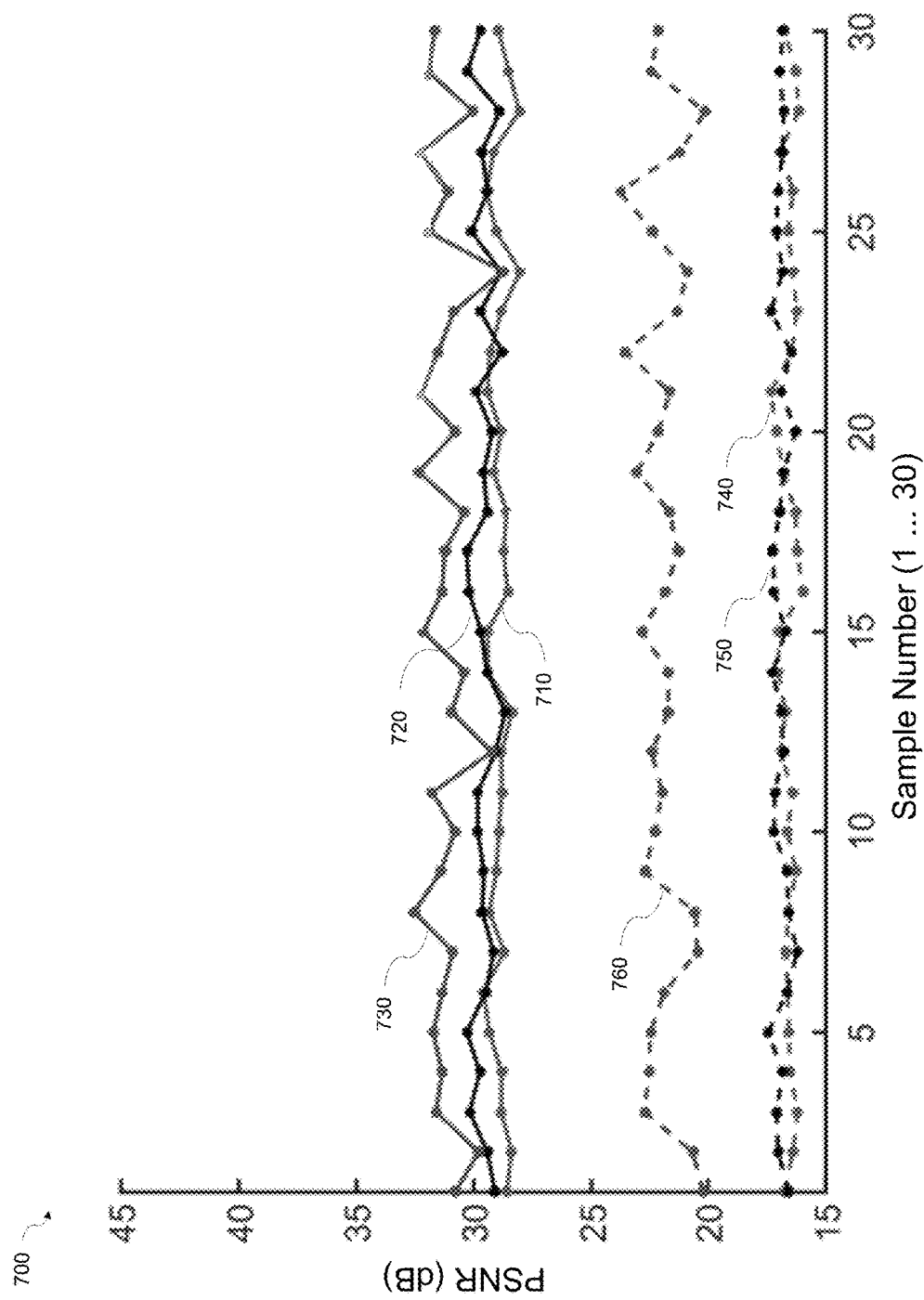
FIG. 7 is a graph illustrating results of an algorithm for fidelity testing according to various aspects of the present disclosure.

FIG. 7 is a graph 700 illustrating results of an algorithm for fidelity testing according to various aspects of the present disclosure. After training a HR dictionary and a LR dictionary on five images, synthetic images of thirty different images that were not part of the training set were generated and analyzed. In FIG. 7, the x-axis lists the number of images from one to thirty, and the y-axis indicates the peak signal-to-noise ratio (PSNR) of each image of the thirty images.

PSNR represents a metric of comparison between the synthetic images and the HR images. The HR images are considered as the "ground truth," although they contain some inherent measurement noise. PSNR may be calculated by Equation 1:

$$PSNR(\widehat{Y}_h, Y_h) = 20 \log_{10} \frac{\|\widehat{Y}_h - Y_h\|_F}{\|Y_h\|_F} \quad (1)$$

Referring again to FIG. 7, the following curves are illustrated:

Curve 710 illustrates the PSNR of each of the thirty synthetic images related to the first perspective images.
Curve 720 illustrates the PSNR of each of the thirty synthetic images related to the second perspective images.
Curve 730 illustrates the PSNR of each of the thirty synthetic images related to the third perspective images.
Curve 740 illustrates the PSNR of each of the thirty LR images related to the first perspective images.
Curve 750 illustrates the PSNR of each of the thirty LR images related to the second perspective images.
Curve 760 illustrates the PSNR of each of the thirty LR images related to the third perspective images.

As can be seen in FIG. 7, improvement of 10-15 dB may consistently be gained across all images and perspectives tested. The PSNR metric is a widely used tool in image processing for measuring the performance of reconstruction algorithms. The values of approximately 30 dB are considered as reconstructions of good quality considering that the reference HR images suffer from considerable measurement noise as well. It should be noted that any image that was used in the training process and the generation of the synthetic images was an image acquired by a SEM.

Figure 8:
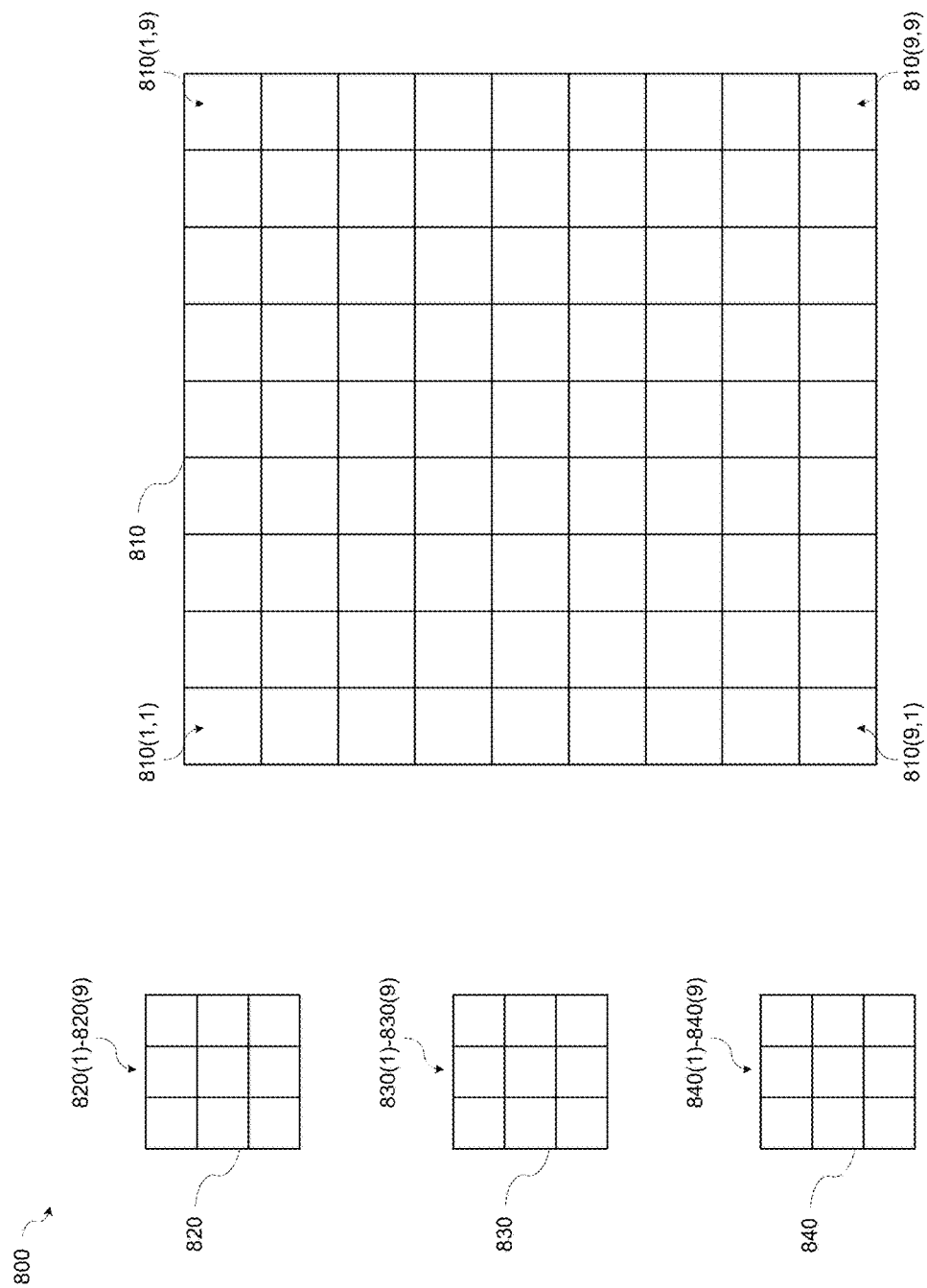
FIG. 8 is a diagram illustrating a LR image that is segmented to eighty-one image patches according to various aspects of the present disclosure.

FIG. 8 is a diagram 800 illustrating a LR image 810 that is segmented to eighty-one image patches according to various aspects of the present disclosure. One of ordinary skill in the art will appreciate that the eighty-one image patches illustrated in FIG. 8 are merely exemplary and that a greater or lesser number of image patches may be used without departing from the scope of the present disclosure.

Referring to FIG. 8, the upper left image patch of the eighty-one image patches may be designated as 810(1,1). The upper right image patch of the eighty-one image patches may be designated as 810(1,9). The lower left image patch of the eighty-one image patches may be designated as 810(9,1). The lower right image patch of the eighty-one image patches may be designated as 810(9,9). A size of each image patch may equal a size of an atom.

FIG. 8 further illustrates a first reference atom 820 that includes nine atom segments 820(1)-820(9), a second reference atom 830 that includes nine atom segments 830(1)-830(9) and a third reference atom 840 that includes nine atom segments 840(1)-840(9). The sparse representation of LR image 810 may be calculated by representing each image patch by a combination of atoms.

Figure 9:
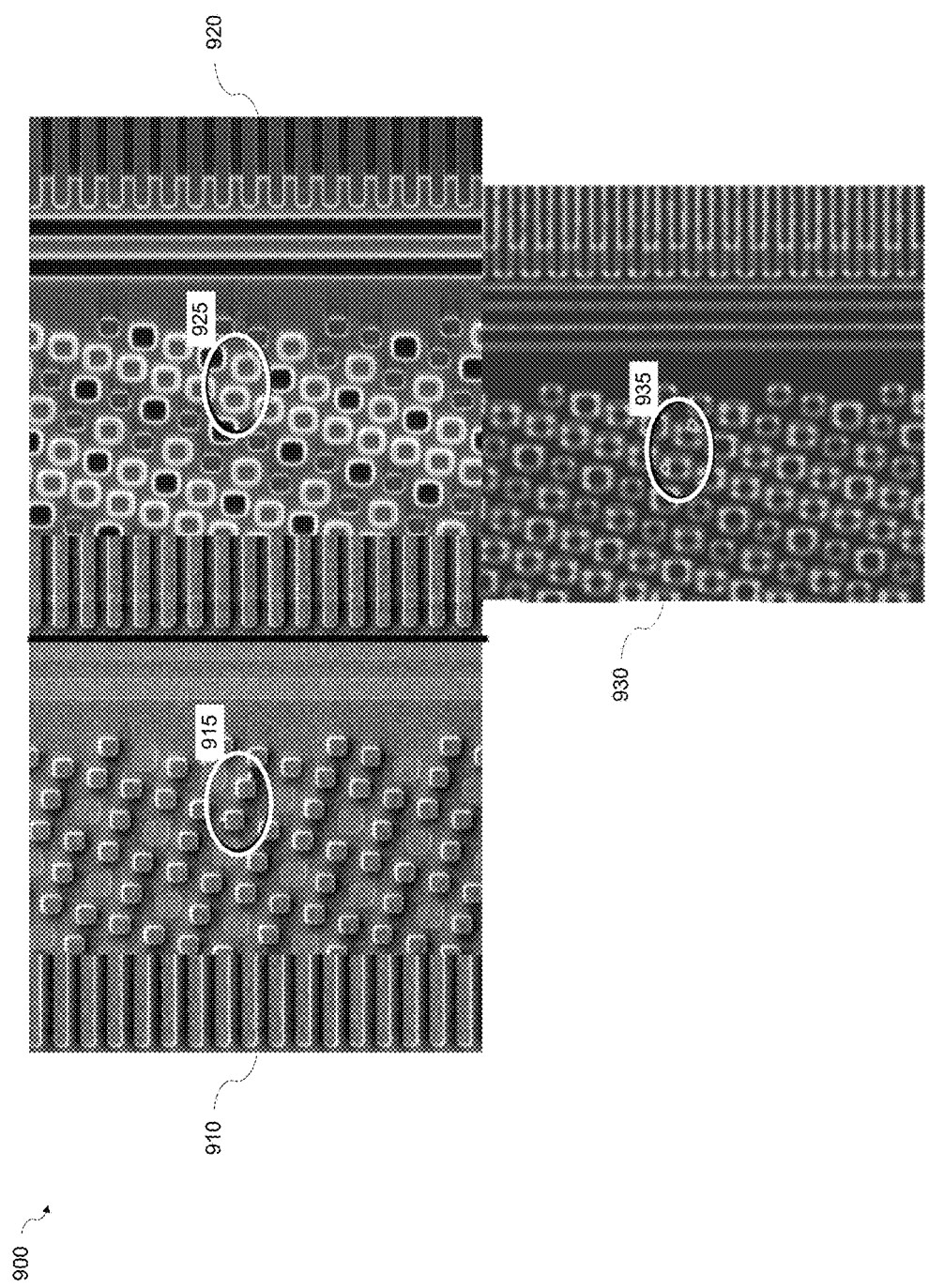
FIG. 9 is an illustration of example images of a charged particle microscope image, a synthetic image, and a confidence level map according to various aspects of the present disclosure.

FIG. 9 is an illustration of example images 900 of a charged particle microscope image 910, a synthetic image 920, and a confidence level map 930 according to various aspects of the present disclosure. Referring to FIG. 9, Zone 915 (represented by the ellipse) of the charged particle microscope image 910 illustrates two defective structural elements. One defective structural element has excess material at the upper facet of the defective structural element. Another defective structural element has excess material at the right facet of the defective structural element.

Zone 925 (represented by the ellipse) of the synthetic image 920 illustrates representations of the two defective structural elements. Zone 935 (represented by the ellipse) of the confidence level map 930 illustrates a drop in the confidence level at locations that correspond to the location of the excess materials.

After the initial design, training data for the learning process of the dictionary may be obtained and organized. A relatively small set of several pairs of both low resolution and high resolution scanned images acquired from the exact same area in a microchip may be sufficient. Patches of appropriate size may be selected from both the LR and HR images simultaneously, and then extracted and stored as part of the training set. The patch extraction process may be randomly performed from the available LR training images and HR training images, followed by a test for each of the extracted patch pairs that ensures the patch pairs contains a significant amount of information from an actual microchip pattern. The testing may prevent the inclusion of patches containing mostly background noise into the dictionary training set.

The training set may be much larger than the number of atoms in the dictionary, for example, approximately one hundred times larger. By taking a large training set containing substantially more elements than in the dictionary, a thorough learning stage may be guaranteed which yields a robust dictionary able to faithfully describe any possible microchip feature. The collected training data may be then inserted into the dictionary learning process. One of ordinary skill in the art will appreciate that training sets may be larger or smaller than one hundred times the number of atoms in the dictionary without departing from the scope of the present disclosure.

An example of a dictionary learning process may be a modified version of the K-SVD algorithm. However, embodiments in accordance with the present disclosure are not limited to this implementation. One of ordinary skill in the art will appreciate that any dictionary learning process could be adapted to this task without departing from the scope of the present disclosure.

A dictionary learning process may use an iterative computational approach to find an approximate solution for the following non-convex minimization problem of Equation 2:

$$[D, X] = \arg\min_{D', X'} \| T - D'X' \|_F^2, \text{ subject to } \|x_j\|_0 < k_0 \ \forall \ j, \quad (2)$$

where
T is a constant matrix containing a training sample in each of its columns, i.e., the training set;
D' is the variable dictionary where each of its columns contains an atom;
X' is a variable sparse matrix, holding the representation coefficients that describe T over the dictionary; and
The zero-norm function $\|\cdot\|_0$ counts the number of non-zero elements in its argument, therefore the constraint $\|x_j\|_0 < k_0$, enforces that every training sample from T is described by no more than $k_0$ atoms from the dictionary.

Solving Equation 2 with the modified K-SVD algorithm yields two output arguments. The first output argument may be the dictionary D, containing the best atoms that sparsely represent the training set T, and the second output argument may be the sparse representation X, such that T≈DX. Equation 2 may be adapted by expanding the training set and dictionaries into concatenated pairs of low and high resolution, namely solving Equation 3:

$$\left[\begin{pmatrix} D_\ell \\ D_h \end{pmatrix}, X\right] = \arg\min_{D'_\ell, D'_h, X'} \left\| \begin{pmatrix} T_\ell \\ T_h \end{pmatrix} - \begin{pmatrix} D'_\ell \\ D'_h \end{pmatrix} X' \right\|_F^2, \quad (3)$$

$$\text{subject to } \|x'_j\|_0 < k_0 \ \forall \ j$$

where
Sub-index h refers to a HR term; and
Sub-index l refers to a LR term.
The training set $$T = \begin{pmatrix} T_h \\ T_\ell \end{pmatrix},$$

used as input for the dictionary learning process in Equation 3 contains concatenated and paired LR and HR elements, thus ensuring that the trained dictionaries $D_l$ and $D_h$ are fully synchronized and paired.

An example for the pairing established between the atoms within each dictionary and an image pair used in the creation of the training set is shown in FIG. 6. The accurate mapping between the dictionaries may enable the actual synthetic image reconstruction.

Once the dictionary learning process is completed, the process of synthetic image reconstruction may take place. The process of synthetic image reconstruction may include taking a new LR image acquired by a SEM (that was not part of the training set used to construct the dictionary) and enhancing its resolution by relying on the feature mapping already established between low and high resolution samples. A successfully completed training step ensures that all the possible combinations that span a family of microchips are contained in the compact dictionaries. The dictionaries may now be used to complete the high spectral content of the LR images that was once lost during the SEM acquisition process.

The synthetic image reconstruction process may not require prior information apart from the dictionary constructed in the learning stage. The synthetic image reconstruction process may begin by taking LR images and interpolating them to the HR grid, as seen in FIG. 4. Although the interpolated LR images lie on the same grid as the HR images, their spectral content may have an inherent cut-off frequency determined by the ratio between low and high resolutions.

Next, the interpolated LR images may be divided into subsets (i.e., reference patches). Each LR perspective may be stored in a matrix $Y_\ell \in \mathbb{R}^{n \times N}$, where n is the number of pixels in each image patch, and N is the overall number of reference patches that compose the full low resolution image. After decomposing the image, the minimization problem given by Equation 4 may be solved to obtain the sparse representation X* over the dictionary $D_l$:

$$X^* = \arg\min_X \| Y_\ell - D_\ell X \|_F^2, \text{ subject to } \|x_j\|_0 < k_0 \ \forall \ j \quad (4)$$

The solution to Equation 4 may be obtained by using a fast greedy algorithm, for example, but not limited to, a fast variation of the orthogonal matching pursuit algorithm (OMP). The OMP algorithm may detect, for each patch from the LR image, the most correlated atoms from within the LR dictionary $D_l$. The OMP algorithm then finds the best representation for the patch using those selected atoms. Here, usually only 3-5 atoms may be needed to faithfully describe the information contained in each patch.

The OMP algorithm is fast by nature since it is a greedy algorithm. In each step, the OMP algorithm adds a single element to every column of X, which is the single best atom to sparsely describe a given patch. If the difference between the sparse combination of the already found atoms and the original patch does not meet a predetermined tolerance (dependent on the noise level of the LR image), another atom may be added so as to minimize the difference.

Consequently, the number of non-zero elements in each column of X is incrementally increasing with each iteration of the OMP algorithm until either the tolerance is achieved or the limit of $k_0$ non-zero terms is reached. For computational efficiency, the method may solve Equation 4 by solving for all the columns of X in parallel.

One of ordinary skill in the art will appreciate that other algorithms may be used to obtain the sparse representation X* over the dictionary $D_l$ without departing from the scope of the present disclosure.

The sparse representation stored in the matrix X* may contain all the intrinsic information of the scanned sample and may allow the intrinsic information to be spanned in the higher resolution without the redundant noise. The synthetic image of the region in the microchip may be obtained by substituting the basis from the LR dictionary to the HR one, as shown Equation 5:

$$\hat{Y}_h = D_h X^* \quad (5)$$

Equation 5 describes a simple algebraic step of multiplying two matrices, yet has a low computational complexity since both the dictionary size is small and only a few of the coefficients in each column of $X^*$ are different from zero. After calculating the matrix $\hat{Y}_h$, the patches contained in it may be stitched together to form the final SR images.

An example of sets of LR, HR, and SR images are illustrated in FIG. 4. As shown in FIG. 4, the synthetic images may be sharper and cleaner as a result of completing the missing spectral information and removing the unwanted noise. The task of enhancing the resolution of SEM images is essentially extrapolating the unknown high-frequencies missing from the low resolution images while removing much of the noise introduced during the SEM image acquisition.

The formulation in Equation 5 takes into account a single perspective acquired by the SEM in the LR mode and used to recover the synthetic image. When using multiple perspectives, the method may be further improved by exploiting the fact that all different perspectives are acquired simultaneously from the exact same area of the scanned specimen.

Generalizing the dictionary learning process to multiple perspectives, the dictionary learning process may train dictionaries for both low and high resolution for a plurality of perspective (for example—three perspectives, for a total of six paired dictionaries). One of ordinary skill in the art will appreciate that a greater or lesser number of perspectives and/or paired dictionaries may be employed without departing from the scope of the present disclosure.

To produce the paired dictionaries, paired training samples may be simultaneously extracted for all the perspectives and resolutions. Training sets $T^i$ may be generated where $$T^i = \begin{pmatrix} T^i_\ell \\ T^i_h \end{pmatrix}, \text{ for every } i\text{th perspective } (i = 1, 2, 3, \ldots).$$

The training samples may be extracted from the same respective areas for all the perspectives, so that all the sets are matched, thus leading to paired dictionaries. The dictionary learning process may be performed once using the K-SVD algorithm as indicated by Equation (3) for a single chosen perspective, preferably the perspective with the least amount of noise, to obtain a sparse representation $X_0$. The dictionaries may then be computed as shown in Equation (5) by the Moore-Penrose pseudo inverse, indicated by † in Equation 6, using the same sparse representation $X_0$ multiplied by the respective training sets for every i:

$$\begin{pmatrix} D^i_\ell \\ D^i_h \end{pmatrix} = \begin{pmatrix} T^i_\ell \\ T^i_h \end{pmatrix} X_0^\dagger, i = \{1, 2, 3\} \quad (6)$$

By computing Equation 6, the dictionaries for all the different perspectives and resolutions may be paired, as seen in FIG. 6. The step of sparse pursuit and reconstruction may be generalized as well to account for the mutual information contained between the different perspectives. By modifying Equation (3), the sparse representation that spans the different perspectives may be obtained using Equation 7:

$$X^* = \underset{X}{\text{argmin}} \left\| \begin{pmatrix} Y^1_l \\ Y^2_l \\ Y^3_l \end{pmatrix} - \begin{pmatrix} D^1_l \\ D^2_l \\ D^3_l \end{pmatrix} X \right\|_F^2, \text{ s.t } \|x_j\|_0 < k_0 \; \forall j \quad (7)$$

Reconstruction for every ith perspective may be based on the combined sparse representation $X^*$ by solving Equation 8:

$$\hat{Y}_h^i = D_h^i X^* \quad (8)$$

The mutual information associated with the different perspectives may be used to further improve results beyond currently known SR techniques.

Referring back to FIG. 4, the generation of synthetic image 410, synthetic image 411, and synthetic image 412 was preceded by generating, during a dictionary learning process, six dictionaries, i.e., three LR dictionaries and three HR dictionaries, for the three perspectives using the sparsity-based methodology described by Equation 2. The six dictionaries were constructed from a training set of five SEM images from the three perspectives. The images used for the training stage were different than the images that were processed to provide the synthetic images of FIG. 4.

After a completion of the dictionary learning process, LR image 404, LR image 405, and LR image 406 were processed to provide synthetic image 410, synthetic image 411, and synthetic image 412 by first applying Equation (3) and then applying Equation (4).

When comparing the synthetic image 410, synthetic image 411, and synthetic image 412 to LR image 404, LR image 405 and LR image 406, the overall sharpness of the contours and features are improved, while the noise is greatly reduced. Comparing synthetic image 410, synthetic image 411, and synthetic image 412 to the HR image 407, HR image 408, and HR image 409 shows that the details and edges may be accurately reconstructed for all three perspectives.

Figure 10:
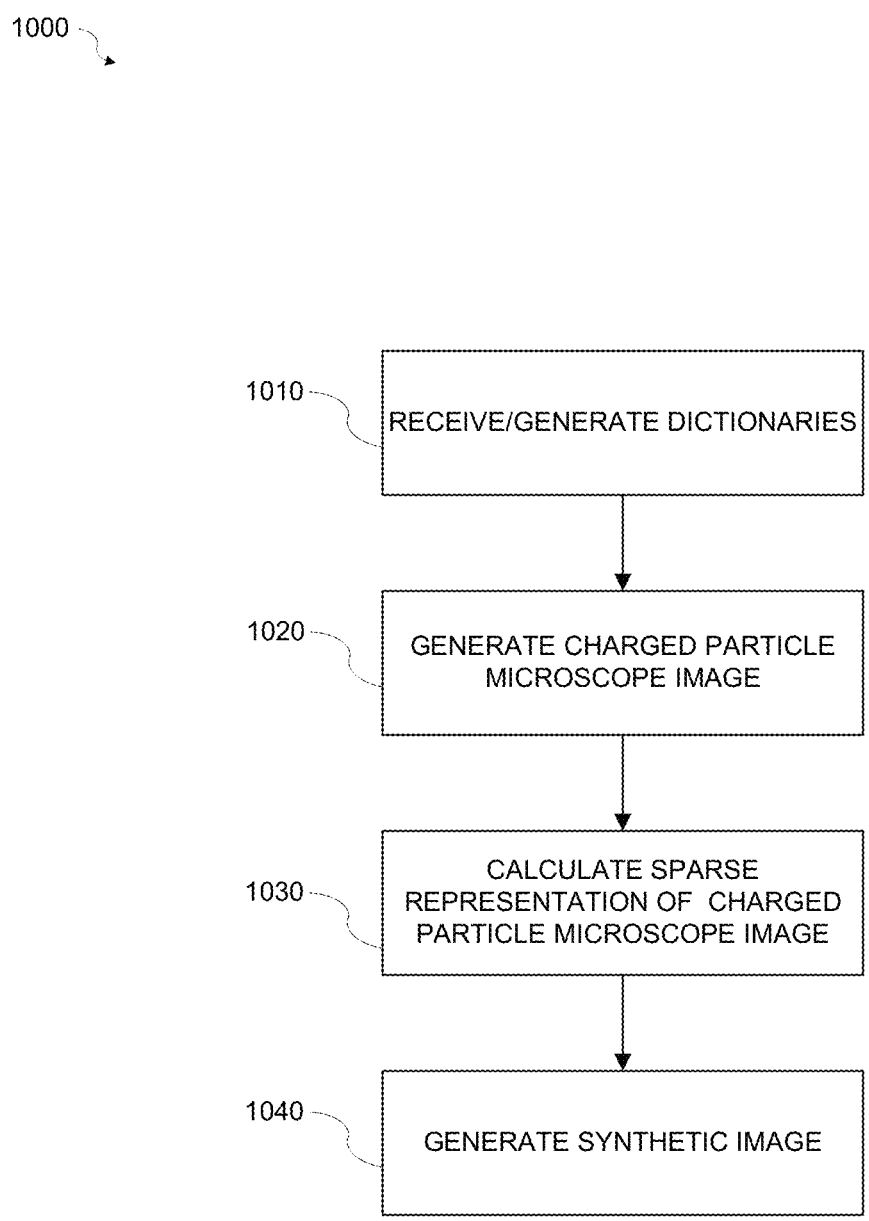
FIG. 10 is a flowchart of a method for generating a synthetic image of a region of an object according to various aspects of the present disclosure.

FIG. 10 is a flowchart of a method 1000 for generating a synthetic image of a region of an object according to various aspects of the present disclosure. Referring to FIG. 10, at block 1010, one or more dictionaries may be generated. The one or more dictionaries may be generating using a dictionary learning process. The dictionary learning process may include generating one or more dictionaries that include multiple first atoms, multiple second atoms, and a mapping between the multiple first atoms and the multiple second atoms. Alternatively, the one or more dictionaries may be may be received from another source, for example, but not limited to a previously generated dictionary stored in a storage location.

At block 1020, a charged particle microscope image of the region of the object may be generated. A charged particle microscope may generate the charged particle microscope image of the region of the object. The generating the charged particle microscope image may include illuminating the region with a charged particle beam and detecting charged particles that are emitted from the region.

At block 1030, a sparse representation of the charged particle microscope image may be generated. The sparse representation of the charged particle microscope image may include multiple first atoms. The charged particle microscope image and the multiple first atoms may be of a first resolution.

At block 1040, a synthetic image of the region of the object may be generated. The synthetic image of the region may be formed from multiple second atoms. The generating of the synthetic image of the region may be based on a mapping between the multiple first atoms and the multiple second atoms. The synthetic image of the region and the multiple second atoms may be of a second resolution. The second resolution may be finer than the first resolution.

The method may return to block 1020 to generate additional synthetic images.

In accordance with various aspects of the present disclosure, the one or more dictionaries may be updated from time to time. For example, the updates may include using images that were acquired during one or more repetitions of blocks 1020-1040 of the method 1000.

Figure 11:
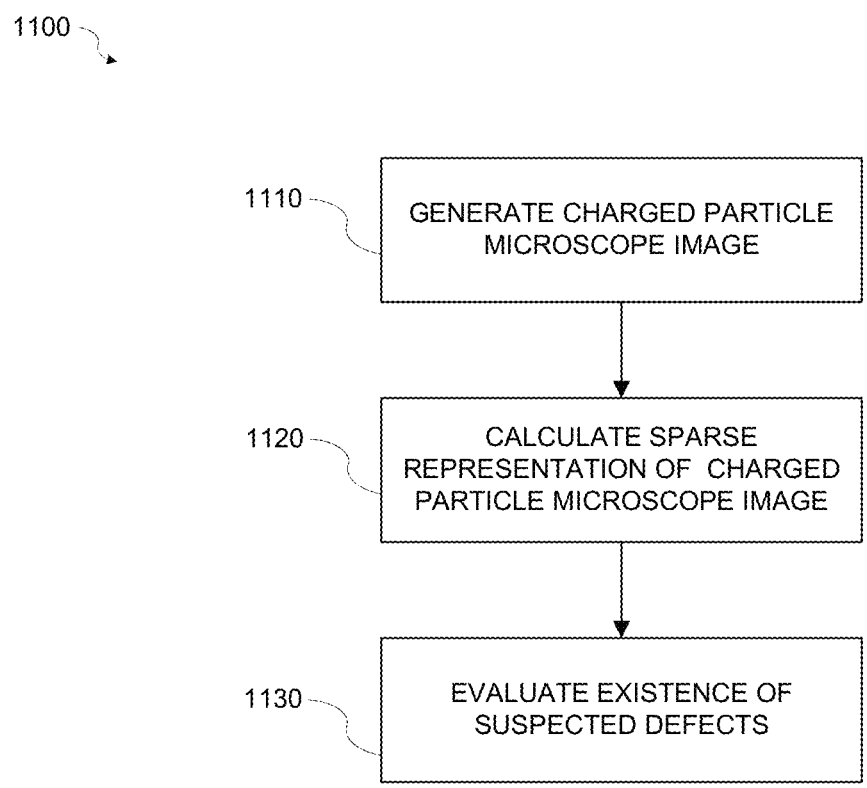
FIG. 11 is a flowchart of a method 1100 for identifying suspected defects in the region of an object according to various aspects of the present disclosure.

FIG. 11 is a flowchart of a method 1100 for identifying suspected defects in the region of an object according to various aspects of the present disclosure. Referring to FIG. 11, at block 1110, a charged particle microscope image may be generated. For example, a charged particle microscope may generate the charged particle microscope image of the region of the object. The generating the charged particle microscope image may include illuminating the region with a charged particle beam and detecting charged particles that are emitted from the region.

At block 1120, a sparse representation of the charged particle microscope image may be generated. The sparse representation of the charged particle microscope image may include multiple first atoms at a first resolution.

At block 1130, an existence of a suspected defect may be evaluated. For example, an existence of a suspected defect in the region based on a number of different first atoms that form an element of the sparse representation of the charged particle microscope image may be evaluated. The evaluating may include calculating the number of different first atoms of each element of the sparse representation. An element of the sparse representation may mean any combination of pixels of the sparse representation.

Any of the mentioned above methods may also be implemented in a computer program for running on a computer system, at least including code portions for performing operations of a method according to the various embodiments when run on a programmable apparatus, such as a computer system or enabling a programmable apparatus to perform functions of a device or system according to the invention. The computer program may cause the storage system to allocate disk drives to disk drive groups.

A computer program may be a list of instructions such as a particular application program and/or an operating system. The computer program may, for example, include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a computer program product. All or some of the computer program may be provided on computer readable media permanently, removably, or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc. A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system. The computer system may for instance include at least one processing unit, associated memory and a number of input/output (I/O) devices. When executing the computer program, the computer system may process information according to the computer program and produce resultant output information via I/O devices.

In the foregoing specification, the various aspects have been described with reference to specific examples of embodiments. It will, however, be evident that various modifications and changes may be made therein without departing from the broader spirit and scope of the disclosure as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the various embodiments described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures described herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations are merely illustrative. The multiple operations may be combined into a single operation, a single operation may be distributed in additional operations, and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, and other embedded systems and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or operations than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the various embodiments have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for generating a synthetic image of a region of an object, the method comprising:
    generating, by a charged particle microscope, a charged particle microscope image of the region of the object;
    calculating a sparse representation of the charged particle microscope image; wherein the sparse representation of the charged particle microscope image comprises multiple first atoms;
    generating the synthetic image of the region, wherein the synthetic image of the region is formed from multiple second atoms;
    wherein the generating of the synthetic image of the region is based on a mapping between the multiple first atoms and the multiple second atoms;
    wherein the charged particle microscope image and the multiple first atoms are of a first resolution; and
    wherein the synthetic image of the region and the multiple second atoms are of a second resolution that is finer than the first resolution.

2. The method according to claim 1 wherein the generating of the charged particle microscope image is preceded by performing a dictionary learning process for generating at least one dictionary that comprises the multiple first atoms and the multiple second atoms.

3. The method according to claim 2 wherein the performing of the dictionary learning process comprises acquiring first resolution charged particle microscope images of a reference object and acquiring a second resolution charged particle microscope images of the reference object.

4. The method according to claim 1 wherein the generating of the charged particle microscope image is preceded by receiving at least one dictionary that comprises the multiple first atoms and the multiple second atoms.

5. The method according to claim 1 wherein the generating of the charged particle microscope image is preceded by performing a dictionary learning process for generating at least one dictionary that comprises multiple first atoms that are related to multiple perspectives of the charged particle microscope and multiple second atoms that are related to the multiple perspectives of the charged particle microscope.

6. The method according to claim 5 wherein the performing of the dictionary learning process comprises calculating a mapping between first atoms and second atoms that are related to different perspectives.

7. The method according to claim 5 wherein the charged particle microscope image is related to a certain perspective of the charged particle microscope and wherein the calculating of the sparse representation of the charged particle microscope image is based on at least one first atom that is related to another perspective of the charged particle microscope.

8. The method according to claim 5 wherein the charged particle microscope image is related to a certain perspective of the charged particle microscope and wherein the calculating of the sparse representation of the charged particle microscope image is based on first atoms related to at least two perspectives out of the multiple perspectives.

9. The method according to claim 5 wherein the charged particle microscope image is related to a certain perspective of the charged particle microscope and wherein the synthetic image is related to another perspective.

10. The method according to claim 1 wherein the generating of the charged particle microscope image is preceded by receiving one or more dictionaries that are related to multiple perspectives of the charged particle microscope.

11. The method according to claim 1 wherein the charged particle microscope image comprises multiple charged particle microscope patches;
    wherein the calculating of the sparse representation of the charged particle microscope image comprises calculating sparse representations of the multiple charged particle microscope patches; and
    wherein the generating of the synthetic image comprises generating multiple synthetic image patches.

12. The method according to claim 11 comprising calculating a confidence attribute for each synthetic image patch of the multiple synthetic image patches.

13. The method according to claim 12 wherein a confidence attribute of a given synthetic image patch of the multiple synthetic image patches is associated with a number of different second atoms that are included in the given synthetic image patch.

14. The method according to claim 1 comprising detecting a suspected defect in the region based on a number of different second atoms that form an element of the synthetic image.

15. The method according to claim 1 wherein the region of the object is an edge region of the object.

16. A method for defect detection, the method comprises:
generating, by a charged particle microscope, a charged particle microscope image of a region of an object;
calculating a sparse representation of the charged particle microscope image; wherein the sparse representation of the charged particle microscope image comprises multiple first atoms; and
evaluating an existence of a suspected defect in the region based on a number of different first atoms that form an element of the sparse representation of the charged particle microscope image, wherein evaluating the existence of the suspected defect includes calculating the number of different first atoms of each element of the sparse representation.

17. A computer program product that stores instructions that once executed by a charged particle microscope cause the charged particle microscope to perform steps comprising:
generate a charged particle microscope image of a region of an object;
calculate a sparse representation of the charged particle microscope image; wherein the sparse representation of the charged particle microscope image comprises multiple first atoms; and
generate a synthetic image of the region, wherein the synthetic image of the region is formed from multiple second atoms;
wherein a generating of the synthetic image of the region is based on a mapping between the multiple first atoms and the multiple second atoms;
wherein the charged particle microscope image and the multiple first atoms are of a first resolution; and
wherein the synthetic image of the region and the multiple second atoms are of a second resolution that is finer than the first resolution.

18. A charged particle microscope, comprising:
charged particle optics;
at least one charged particle detector;
and a processor;
wherein the charged particle optics and the at least one charged particle detector are configured to generate a charged particle microscope image of a region of an object;
wherein the processor is configured to:
calculate a sparse representation of the charged particle microscope image; wherein the sparse representation of the charged particle microscope image comprises multiple first atoms; and
generate a synthetic image of the region, wherein the synthetic image of the region is formed from multiple second atoms;
wherein a generating of the synthetic image of the region is based on a mapping between the multiple first atoms and the multiple second atoms;
wherein the charged particle microscope image and the multiple first atoms are of a first resolution; and
wherein the synthetic image of the region and the multiple second atoms are of a second resolution that is finer than the first resolution.

* * * * *